United States Patent
Boeckenhoff et al.

(10) Patent No.: US 12,222,227 B2
(45) Date of Patent: Feb. 11, 2025

(54) SENSOR DEVICE FOR DETECTING AT LEAST ONE PHYSICAL VARIABLE

(71) Applicant: Balluff GmbH, Neuhausen a.d.F. (DE)

(72) Inventors: Christoph Boeckenhoff, Neuhausen (DE); Robert Meisenbacher, Schonaich (DE); Nick Hof, Neuhausen (DE)

(73) Assignee: BALLUFF GMBH, Neuhausen (DE)

( * ) Notice: Subject to any disclaimer, the term of this patent is extended or adjusted under 35 U.S.C. 154(b) by 130 days.

(21) Appl. No.: 18/105,932

(22) Filed: Feb. 6, 2023

(65) Prior Publication Data

US 2023/0258477 A1    Aug. 17, 2023

(30) Foreign Application Priority Data

Feb. 8, 2022   (DE) .......................... 102022102893.3

(51) Int. Cl.
*G01D 5/24*    (2006.01)
(52) U.S. Cl.
CPC .................................. *G01D 5/2405* (2013.01)
(58) Field of Classification Search
CPC ...... G01D 5/2405; G01D 5/145; G01D 21/00; G01D 2205/18; G01D 5/24; H03K 17/962; H03K 2017/9606; H03K 2217/96023

See application file for complete search history.

(56) References Cited

U.S. PATENT DOCUMENTS

| | | | | |
|---|---|---|---|---|
| 2013/0285735 | A1* | 10/2013 | Snider | H03K 17/962 327/517 |
| 2014/0028295 | A1* | 1/2014 | Chen | F15B 15/2892 324/207.22 |
| 2019/0025959 | A1* | 1/2019 | Kapoor | H03K 17/955 |

FOREIGN PATENT DOCUMENTS

| | | | | |
|---|---|---|---|---|
| DE | 102010031079 A1 | | 1/2012 | |
| DE | 202014011276 U1 | * | 1/2019 | |
| DE | 102018200219 A1 | * | 7/2019 | ......... F16K 37/0033 |
| DE | 102019203878 A1 | * | 9/2020 | ............ G01D 11/245 |

* cited by examiner

*Primary Examiner* — Daniel R Miller
(74) *Attorney, Agent, or Firm* — GableGotwals

(57) ABSTRACT

A sensor device for detecting at least one physical variable, comprising a housing, at least one sensor element arranged in the housing, at least one circuit board arranged in the housing and comprising a circuit arrangement, and at least one input device arranged on the housing for carrying out input operations which are processed in the circuit arrangement to influence the sensor properties, is characterised in that the input device, to realise a touch-sensitive effect, comprises an actuation area, which is arranged on a housing wall and is permeable to electric fields, and a capacitive area, which is arranged on the circuit board or is formed as part of the circuit board, and in that the circuit board is arranged in the housing such that the capacitive area lies directly below the actuation area.

5 Claims, 3 Drawing Sheets

SENSOR DEVICE FOR DETECTING AT LEAST ONE PHYSICAL VARIABLE

CROSS-REFERENCE TO RELATED APPLICATIONS

This United States application claims priority to German Patent Application No. DE 10 2022 102 893.3 filed 8-2-2022, which is incorporated herein by reference.

The invention relates to a sensor device for detecting at least one physical variable according to the preamble of claim 1.

PRIOR ART

Sensor devices of this kind are used for example as position-measuring systems. Such position-measuring systems detect, for example, the position of a working piston along a cylinder axis of a pneumatic cylinder. This position is detected here for example using the Hall effect.

Such a sensor device is known for example from DE 10 2019 203 878 A1. This sensor device comprises a sensor circuit board which is assigned a first sensor array for detecting a first physical variable, and a second sensor array for detecting an electrical capacitance, and a processing device for processing sensor signals of the first sensor array and the second sensor array, as well as a sensor housing which has a recess, in which the sensor circuit board is received, the second sensor array comprising an electrically conductive sensor plate which is received in the recess and which has a contact device with an elastic contact spring. The contact device allows a non-positive and electrically conductive coupling of the sensor plate to the sensor circuit board.

The first sensor array for detecting the first physical variable can be designed for example to detect a magnetic flux density or a magnetic field strength or a temperature or the like. In order to provide an input possibility, the sensor device comprises the second sensor array, which is designed to detect an electrical capacitance. This allows the detection of an operation intention of an operator without the use of moving parts, such as a microswitch for example. In this sensor device the touch-sensitive sensor plate is connected in a complex manner with the aid of an elastic contact spring to the sensor circuit board, this contact spring allowing a frictionally engaged and electrically conductive coupling of the sensor plate to the sensor circuit board. Such a design requires not only a complex production and assembly, but also a corresponding installation space for the arrangement of the sensor plate.

In addition, sensors exist in which, for example, buttons are used. Buttons of this kind likewise require a large amount of space and further structural elements. They prevent an increasing miniaturisation. In addition, mechanical buttons become worn and have to be sealed due to moisture/water ingress. In many cases, the buttons are so small that a tool, for example a pin, is also required for actuation.

Possibilities for input by means of a special adjustment tool, for example a magnet, which, contactlessly from outside, allows different switched states on a switch assembly that is installed inside a housing and that cooperates with the magnet are also known. Optical buttons, resistive buttons, or capacitive buttons on a circuit board provided specifically for this purpose are also conceivable. Optical buttons, however, require protection against external light and dirt. Resistive buttons are sensitive to dirt and moisture. Capacitive buttons, which are arranged on a circuit board provided specifically for this purpose, are costly and complicate the construction and manufacturing process.

The object of the invention is therefore to provide a sensor device in which a user can have a direct influence on a processing of sensor signals in the sensor device, with the above-mentioned disadvantages being overcome.

DISCLOSURE OF THE INVENTION

This object is achieved by a sensor device having the features of claim 1. Due to the arrangement of the capacitive area directly on the circuit board or as an integral part of the circuit board and the positioning of the circuit board in the housing such that the capacitive area lies directly below an actuation area which is arranged in a housing wall, a compact, easily realised structure is achieved. In particular, additional components, such as an additional sensor plate or the like, can be spared. Rather, the capacitive area is formed directly on the circuit board or as an integral part of the circuit board.

This arrangement not only allows a low spatial requirement, it is producible in a simple way and in particular economically, and is also wear-free in comparison, for example, to mechanical solutions. In addition, it is characterised by a low energy requirement, for example in comparison to optical solutions. It is additionally resistant to vibrations. In addition, it is resistant to corrosion. Since the circuit board can assume practically any form, for example a straight, a curved, a rounded form and the like, the sensor area, which is formed on the circuit board or as part of the circuit board, can be easily adapted to curved or rounded housing contours.

A particularly advantageous aspect of the invention provides that the capacitive area is arranged on an edge of the circuit board and the circuit board is arranged perpendicularly to the actuation area such that the edge of the circuit board and the capacitive area arranged thereon lie under the contact area. Due to this arrangement of the capacitive area on the edge of the circuit board, no circuit board face is used to form the capacitive area. The circuit board face is therefore available entirely for the circuit arrangement.

A particularly advantageous aspect of the invention provides that the capacitive area is realised on the edge of the circuit board by metallisation of the edge of the circuit board. In this way, additional components can be spared entirely, for example a metal strip, which is arranged on the edge of the circuit board and the like. The metallisation of the side edges is a standard process in circuit board production which incurs only very low costs. Thus, no additional component parts are required, as is the case in the solutions known from the prior art. In addition, the metallised side edges are realised with much smaller tolerances, which allows smaller wall thicknesses of the housing of the sensor device or of the actuation area in the housing wall, said actuation area being permeable for electric fields.

A particularly advantageous aspect of the invention provides that the housing has the form of an elongate cube, the width of which is smaller than its height and the height of which is smaller than its length, such that two long narrow housing faces and two long wide housing faces exist, and such that the actuation area is arranged in a long narrow housing face and the circuit board is arranged parallel to a long wide housing face. Such a housing form is in particular very advantageous in the position detection of the pneumatic cylinder described at the outset, since this housing can be inserted into a corresponding recess on the pneumatic cylinder. In this case the elongate circuit board is installed upright to a certain extent in the housing and its metallised edge lies opposite the long narrow housing face in which the actuation area is arranged. A long actuation area is also realisable as a result, which allows a corresponding variety of circuit options.

The actuation area is advantageously greater than the capacitive area, so that the capacitive area lies fully in the actuation area.

The actuation area consists of a material of high permittivity, so that a reliable actuation is possible capacitively.

The sensor device can perform different tasks. In particular, the sensor can be a sensor from the group of: magnetic field sensor, acceleration sensor, temperature sensor, pressure sensor, flow sensor, brightness sensor. The sensor device is particularly advantageously used with a magnetic field sensor in order to allow the detection, already mentioned above, of the position of a piston in a pneumatic cylinder with use of the Hall effect.

EMBODIMENTS OF THE INVENTION

Figure 1:
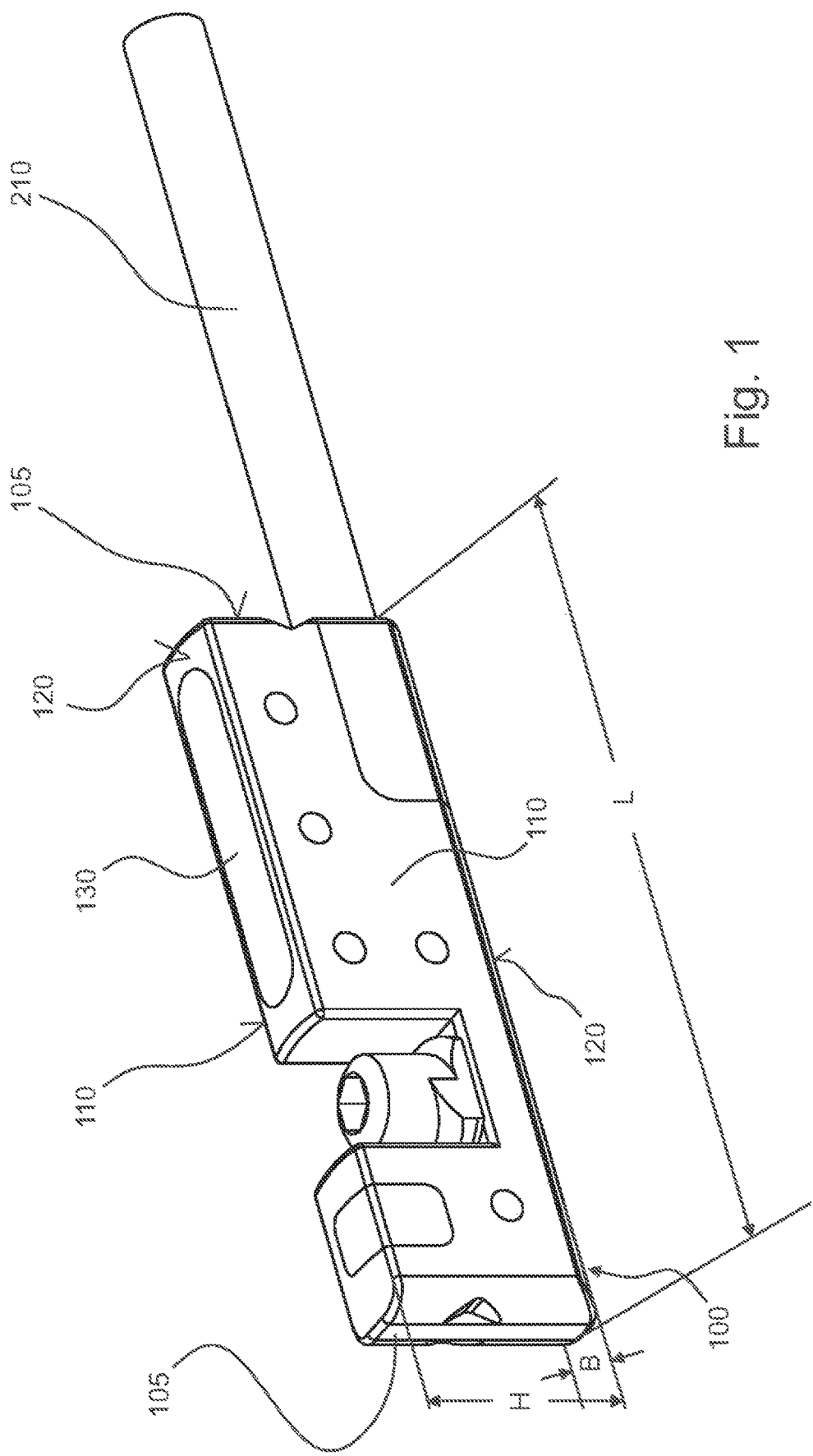
FIG. 1 shows an isometric view of a sensor device according to the invention.
Figure 2:
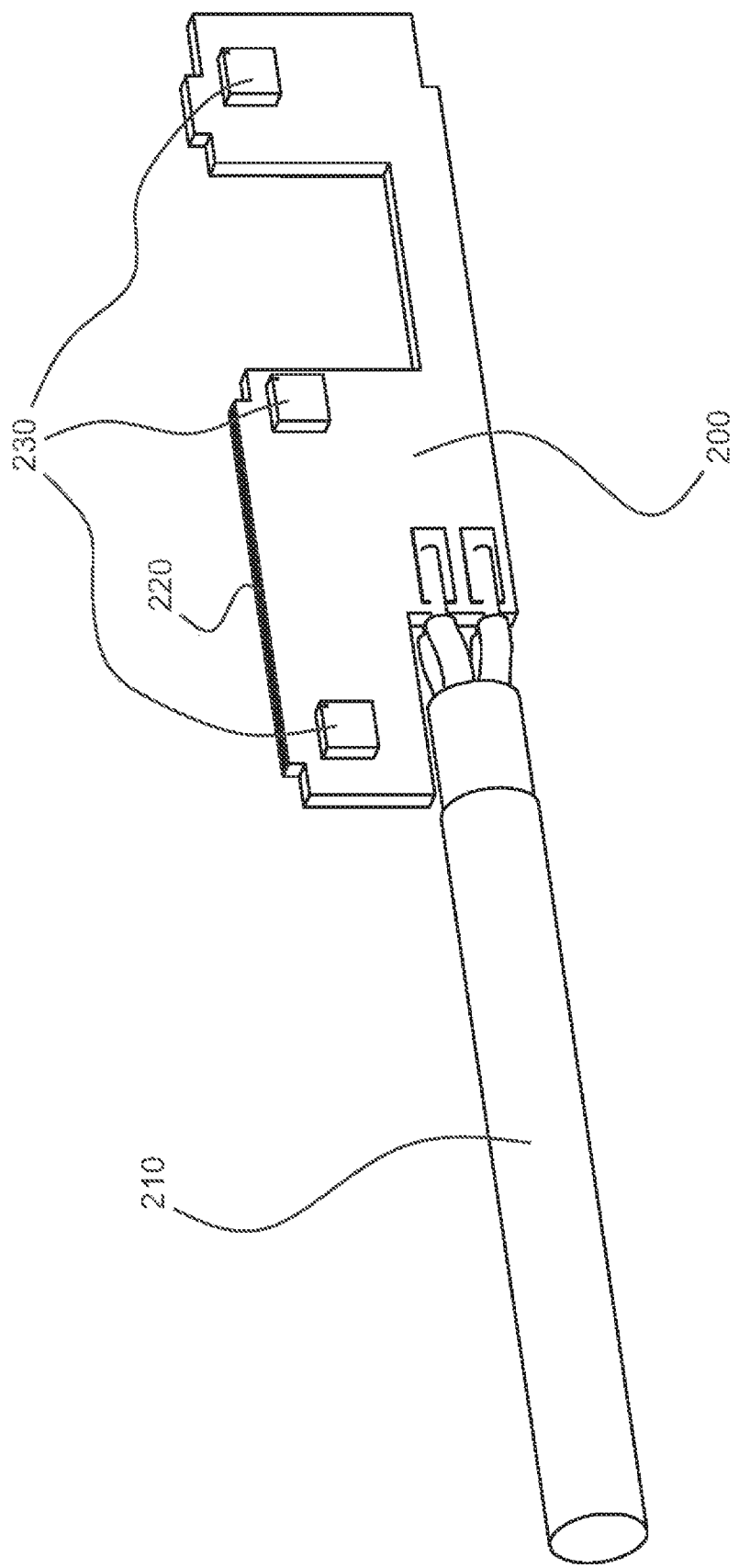
FIG. 2 shows an isometric side view of a circuit board which is arranged in a sensor device shown in FIG. 1.

A sensor device is shown schematically in FIG. 1 and can be used for example to detect a position of a working piston along a cylinder axis of a pneumatic cylinder. This sensor device comprises a housing 100 which has substantially the form of an elongate cube, the width B of which is smaller than its height H, and the height H of which is much smaller than its length L. The cube has rounded end faces 105, and two long narrow housing faces 110 and two long wide housing faces 120. An actuation area 130 is arranged in one of the long narrow housing faces 110 and is made of material of high permittivity. The housing itself can be produced from a wide range of different nonconductive materials. There is arranged in the housing 100 a circuit board 200, which likewise has an elongate form adapted to the dimension of the housing. Three Hall elements 230 are arranged on the circuit board 200 and serve, for example, to detect the position of a piston of a piston-cylinder unit in which the sensor device is arranged. In addition, switch devices (not shown) for processing the sensor signals are arranged on the circuit board 200. The circuit board 200 has a metallisation 220 on an edge. This edge, in the installed state of the circuit board 200, is arranged opposite the actuation area 130. The circuit board 200 runs here parallel to the long wide housing faces 120; it is perpendicular to the long narrow housing faces 110. The metallised edge 220 lies here directly below the actuation area 130. The actuation area 130 is larger than the metallised edge 220 of the circuit board 200. A connection line 210, which on the one hand serves for supplying energy, and on the other hand for reading sensor data, leads to the circuit board 200.

Figure 3:
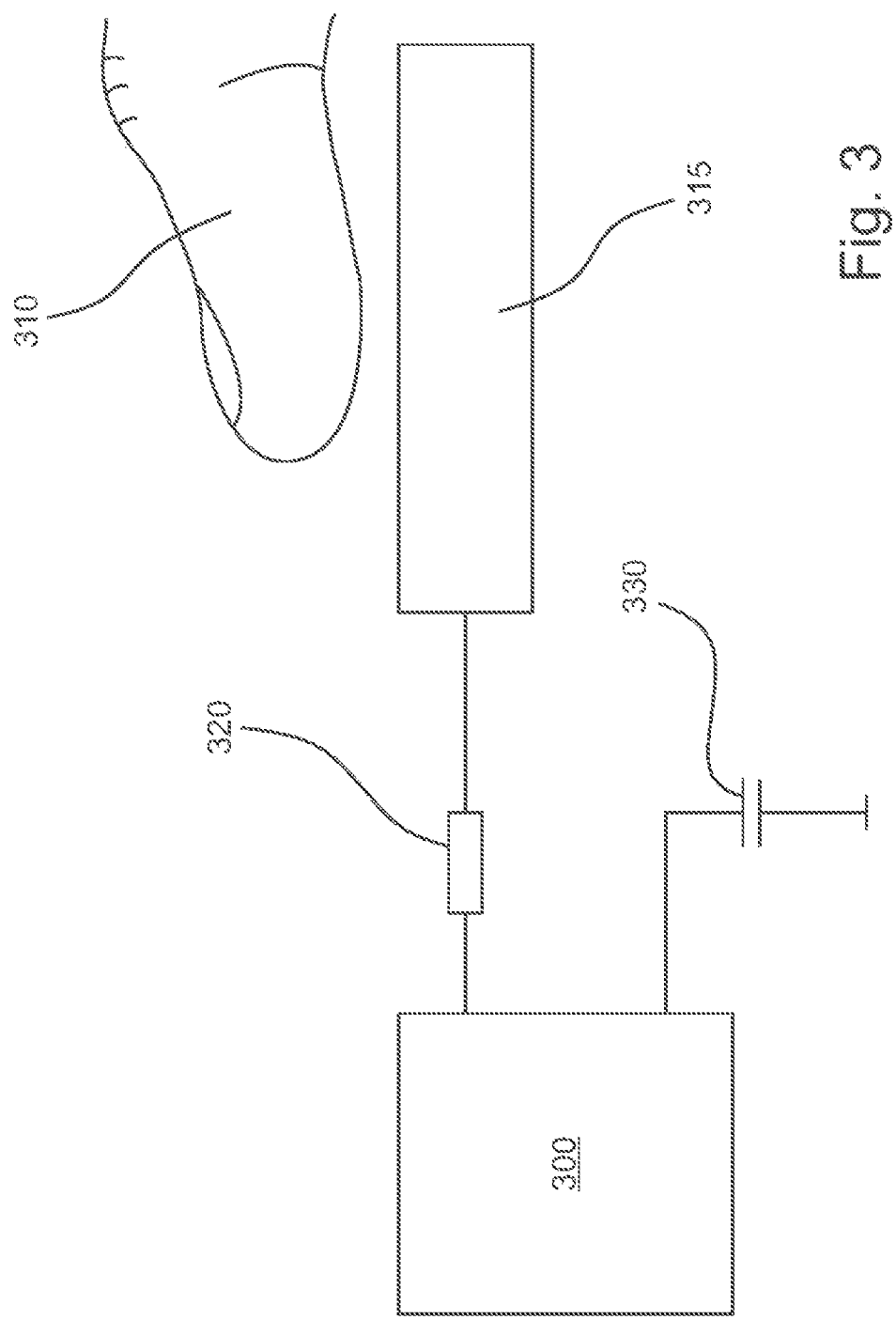
FIG. 3 shows a circuit arrangement of the sensor device according to the invention.

A circuit arrangement for detecting and evaluating the sensor signals is shown in FIG. 3. A finger 310 of an operator is arranged above a capacitive area 315. The capacitive area 315 is influenced by the approaching finger 310. A resistor 320 serves as ESD protection of the downstream circuit.

A sampling capacitor 330 is provided. Reference sign 300 represents a sensing controller which detects the change of the capacitance of the area 315 with the aid of the sampling capacitor 330 and translates it into digital information. Here, the charge transfer acquisition principle, which is known per se, is used. Other methods are also possible, purely in principle, in order to determine the change in capacitance of the area 315. The sensing controller 300 can both be constructed from discrete components, and can be realised as an individual integrated circuit or also can be embodied integrated in a microcomputer.

The circuit board 200 is arranged upright to a certain extent in the housing 100, so that the metallised edge 220 is opposite the actuation area 130. The metallisation of the side edges is a standard process in circuit board production which incurs only very low costs. An additional circuit board which serves as a sensor element is thus unnecessary. In addition, the metallised side edge 220 can be realised with much smaller tolerances, whereby smaller wall thicknesses of the housing of the position-measuring system are made possible. The outer edge can be realised for example by means of laser processes with accuracy to within a few μm. The metallisation itself likewise has only tolerances in the region of a few μm. For this reason, when overmoulding the sensor it is possible to work with much smaller wall thicknesses, since the housing wall only has to compensate for a smaller tolerance. The shorter the distance from the capacitive area, the smaller the capacitive area itself may be whilst maintaining the same sensitivity.

Due to the compactness of the structure, the power consumption and thus the inherent heating must be minimised. The input device with a touch-sensitive effect in the form of the capacitive area is power- and space-saving and particularly suitable for integration in very small position sensors. In addition to the damping, the moisture in the surrounding environment can be measured by the capacitive area in the form of the metallised edge 220, and hereby additional condition monitoring information can be made available. A further advantage of this solution lies in the fact that the circuit board can assume any form, for example a straight, a curved, or a rounded form, and thus can follow any housing forms to a certain extent.

The invention claimed is:

1. Sensor device for detecting at least one physical variable, said sensing device comprising:
    a housing,
    at least one sensor element arranged in the housing,
    at least one circuit board arranged in the housing and comprising a circuit arrangement,
    at least one input device arranged on the housing for carrying out input operations which are processed in the circuit arrangement to influence the sensor properties,
    wherein the at least one input device, to realise a touch-sensitive effect, comprises an actuation area, which is arranged on a housing wall and is permeable to electric fields, and a capacitive area, which is arranged on the circuit board or is formed as part of the circuit board,
    wherein the circuit board is arranged in the housing such that the capacitive area lies directly below the actuation area,
    wherein the capacitive area is arranged on an edge of the circuit board and the circuit board is arranged perpendicularly to the actuation area such that the edge of the circuit board and the capacitive area arranged therein lie below the actuation area, and in that the capacitive area is realized on the edge of the circuit board by metallisation of the edge of the circuit board.

2. The sensor device according to claim 1, wherein the housing has a form of an elongate cube, a width (B) of which is smaller than its height (H), and the height (H) of which is smaller than its length (L), such that two long narrow housing faces and two long wide housing faces exist, in that the actuation area is arranged in a long narrow housing face, and in that the circuit board is arranged parallel to a long wide housing face.

3. The sensor device according to claim 1, wherein the actuation area is larger than the capacitive area, so that the capacitive area lies fully in the actuation area.

4. The sensor device according to claim 1, wherein the actuation area is made of a material of high permittivity.

5. The sensor device according to claim 1, wherein the sensor element is a sensor selected from the group of: magnetic field sensor, acceleration sensor, temperature sensor, pressure sensor, flow sensor, and brightness sensor.

\* \* \* \* \*